United States Patent [19]

Schoofs et al.

[11] Patent Number: 5,418,501

[45] Date of Patent: May 23, 1995

[54] SAWTOOTH OSCILLATOR

[75] Inventors: Franciscus A. C. M. Schoofs; Eise C. Dijkmans, both of Eindhoven, Netherlands

[73] Assignee: U.S. Philips Corporation, New York, N.Y.

[21] Appl. No.: 48,609

[22] Filed: Apr. 16, 1993

[30] Foreign Application Priority Data

Jun. 15, 1992 [NL] Netherlands .................. 9201052

[51] Int. Cl.$^6$ ............................................. H03K 4/501
[52] U.S. Cl. ..................... 331/111; 331/143; 327/131; 327/132; 327/134
[58] Field of Search ................ 331/111, 143; 307/228; 328/181, 183, 185

[56] References Cited

U.S. PATENT DOCUMENTS

| | | | |
|---|---|---|---|
| 3,364,441 | 1/1968 | Rogers | 331/111 |
| 4,131,807 | 12/1978 | Korver | 331/111 |
| 4,415,869 | 11/1983 | Duijkers | 331/111 |
| 5,057,707 | 10/1991 | Pigott | 331/111 |

OTHER PUBLICATIONS

Timer IC's 555 (Signetics Integrated Circuits Data Handbook 1978, pp. 243-245, pp. 717-733, (month unknown).

Primary Examiner—Andrew M. Dolinar
Attorney, Agent, or Firm—Bernard Franzblau

[57] ABSTRACT

A sawtooth oscillator includes a current source having an output coupled to a first capacitor for supplying it with a charge current (I). A discharge circuit discharges the first capacitor during a discharge period (TDS) in response to a voltage on the first capacitor. A second capacitor is coupled to the output of the current source. A switch interrupts the supply of charge current to the first capacitor during an interrupt period (TIS). Part of the charge current occurs during the discharge period (TDS). Subsequent to the interrupt period, the first capacitor receives a charge surplus built up by the charge current in the second capacitor. The current supply to the first capacitor is temporarily interrupted at least during a part of the discharge period. The second capacitor operates as an auxiliary capacitor in which a charge is stored which would otherwise have been supplied to the first capacitor. After the interrupt period the charge stored in the second capacitor is supplied back to the first capacitor. In this way substantially no charge current is lost during a total time period of a charge and discharge cycle. In the total time period the whole charge current of the current source ends up in the first capacitor so that tolerances in the discharge period do not affect the oscillation frequency of the sawtooth oscillator.

15 Claims, 3 Drawing Sheets

SAWTOOTH OSCILLATOR

BACKGROUND OF THE INVENTION

This invention relates to a sawtooth oscillator comprising a first capacitor, a current source having an output coupled to the first capacitor for supplying a charge current to the first capacitor, and means for discharging the first capacitor during a discharge period in response to a voltage on the first capacitor. Such an oscillator is generally known from manuals and is used in commercially available Timer ICs of the 555 type described in the Signetics Integrated Circuits Data Handbook, 1978. The first capacitor is charged by the current source. Once the voltage on the first capacitor exceeds a first threshold, the first capacitor is discharged by the discharging means, usually a transistor connected in parallel with the first capacitor, until a second threshold voltage is reached at which the discharge is terminated. The first capacitor is then charged again by the current source. The voltage on the first capacitor then has a sawtooth shape. The discharge period is the period of time elapsing between the capacitor reaching the first threshold value and reaching the second threshold value. The charge period is the period of time elapsing between the capacitor reaching the second threshold value and reaching the first threshold value. The overall period of time of a charge and discharge cycle is the sum of the discharge and charge periods. This sum determines the frequency of the oscillation. Due to tolerances in the discharging means the discharge period is not fixed. If the discharge transistor is relatively small, it will switch relatively rapidly, but has a relatively large internal resistance. In the case of a relatively large discharge transistor the reverse is true. As a result of these tolerances the accuracy of the oscillation frequency is adversely affected.

SUMMARY OF THE INVENTION

It is an object of the invention, for example, to provide a sawtooth oscillator whose oscillation frequency is less sensitive to tolerances in the discharge period of the first capacitor. Thereto, according to the invention a sawtooth oscillator of the type mentioned in the opening paragraph is characterized in that the sawtooth oscillator further includes: a second capacitor coupled to the output of the current source, means for interrupting the supply of charge current to the first capacitor during an interrupt period, part of which charge current occurs during the discharge period, supply means for supplying, subsequent to the interrupt period, the first capacitor with a charge surplus built up by the charge current in the second capacitor.

The current supply to the first capacitor is temporarily interrupted by the interrupting means for at least part of the discharge period. The second capacitor operates as an auxiliary capacitor in which a charge is stored which would otherwise have ended up in the first capacitor. Alter the interrupt period the charge stored in the second capacitor is supplied back to the first capacitor by the current supply means. In this fashion it is achieved that less or even substantially no charge current is lost for the total period of time of a charge and discharge cycle. The latter is the case if the discharge period occurs in the interrupt period. In the total period of time the whole charge current of the current source eventually ends up in the first capacitor so that tolerances in the discharge period no longer play any role.

In order to achieve that the charge surplus built up in the second capacitor is actually supplied back to the first capacitor, a first embodiment of a sawtooth oscillator according to the invention is characterized in that the supply means comprise: a voltage source coupled to a terminal of the second capacitor, which terminal is remote from the output of the current source, a voltage-controlled resistor having a main current path connected in series with the interrupting means and comprising a control terminal for connection a control signal to controls the resistance of the main current path, a reference voltage source and an amplifier having an inverting input and a non-inverting input, one of which inputs being coupled to the reference voltage source and the other input being coupled to the output of the current source. This amplifier has an output which is coupled to the control terminal of the voltage-controlled resistor.

These measures make the voltage difference across the second capacitor, subsequent to the interruption of the charge current supply to the first capacitor, equal again to the voltage difference across the second capacitor prior to the interruption of the charge current supply. The charge surplus then has been eliminated. During this operation the amplifier and the voltage-controlled resistor retain the voltage on the output of the current source at the reference voltage level.

In a second embodiment of a sawtooth oscillator according to the invention, the interrupting means and the supply means are advantageously combined. This embodiment is characterized in that the interrupting means and the supply means comprise: a switched voltage source coupled to a terminal of the second capacitor, which terminal is remote from the output of the current source, for supplying said terminal with a voltage which, during the interrupt period, deviates from the voltage outside the interrupt period, along with a reference voltage source and a first transistor. The first transistor comprises a first main electrode, a second main electrode and a control electrode which are coupled to the output of the current source, the first capacitor and the reference voltage source, respectively.

The first transistor is cut off once said terminal of the second capacitor is switched over by the switched voltage source and then operates as the interrupting means. Once the terminal has been switched back to the original voltage, the first transistor is rendered conductive again while between the control electrode and the first main electrode the threshold voltage characteristic of that transistor provides a constant voltage difference between the output of the current source and the reference voltage source.

BRIEF DESCRIPTION OF THE DRAWINGS

These and further aspects of the invention will be described and explained with reference to the appended drawing, in which.

In these drawing Figures components having like functions or connotations have like reference characters.

DESCRIPTION OF THE PREFERRED EMBODIMENTS

Figure 1:
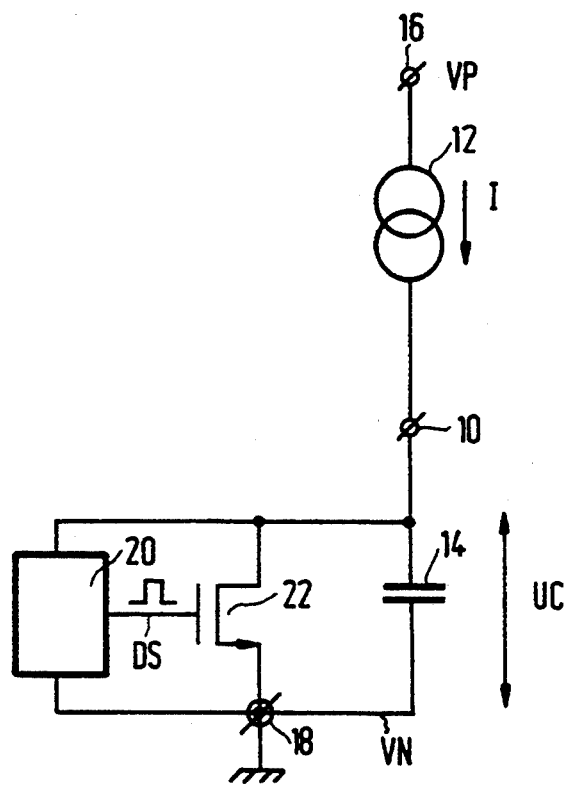
FIG. 1 shows a circuit diagram in explanation of the operation of a prior-art sawtooth oscillator.
Figure 2:
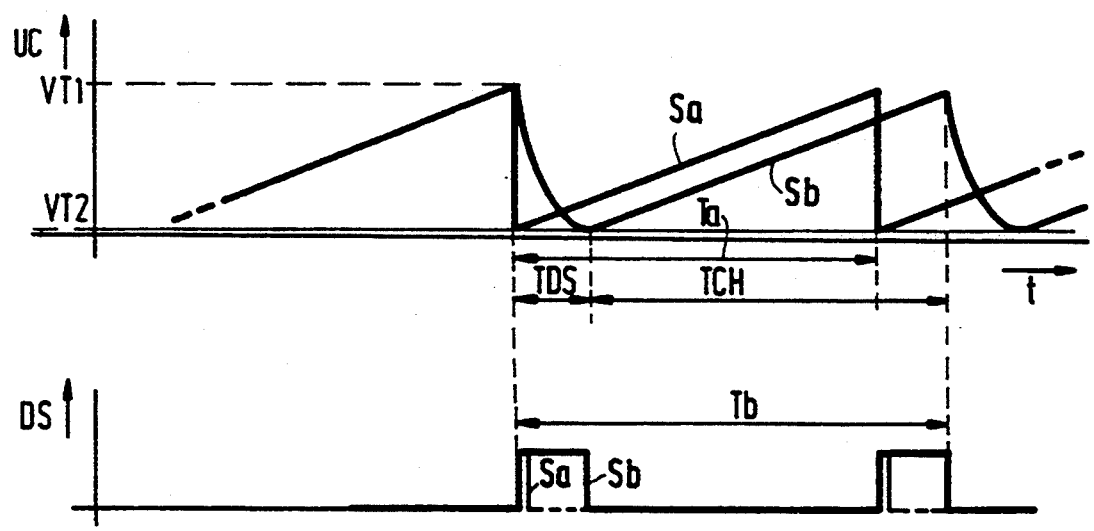
FIG. 2 shows diagrams in explanation of the operation of the prior-art sawtooth oscillator shown in FIG. 1.

FIG. 1 shows a circuit diagram of a sawtooth generator related to the sawtooth oscillator as can be realized with a Timer IC of the 555 type. An output 10 of a current source 12 is coupled to a first capacitor 14 and supplies a charge current I to the first capacitor 14. The current source 12 and the first capacitor 14 are connected in series between a positive supply terminal 16 for connecting a positive supply voltage VP, and a negative supply terminal 18 for connecting a negative supply voltage VN which is connected to ground. Across the first capacitor 14 the charge current I develops an increasing voltage UC which is compared in a window comparator 20 with a first threshold voltage VT1. When the first threshold voltage VT1 is reached, the window comparator 20 activates by means of a discharge signal DS the control electrode of the discharge transistor 22 which is connected in parallel with the first capacitor 14. This action renders the discharge transistor 22 conductive and discharges the first capacitor 14, so that the voltage UC decreases. Once the voltage UC has dropped to a second threshold voltage VT2, the discharge transistor is again rendered non-conductive by means of the discharge signal DS of the window comparator 20. FIG. 2 shows the variation of the voltage UC and the discharge signal DS plotted against time. The signals denoted Sa occur if the discharge is effected very rapidly relative to the total period of time T of the charge and discharge cycle. The signals denoted Sb show the same but for the case where the discharge takes up a relatively long discharge period TDS. The charge period TCH is the same for both situations, because this period is determined by the charge current I and the value of the first capacitor 14. The result is that the total period of time T which is the sum of the discharge period TDS and the charge period TCH is greater in case Sb than it is in case Sa. Due to tolerances in the discharge period TDS, the total period of time T and thus also the oscillation frequency 1/T will not be fixed. This necessitates an adjustment if an accurate oscillation frequency is desired. The tolerances in the discharge period TDS are caused, for example, by tolerances in the dimensions of the discharge transistor 22. A relatively large discharge transistor 22 has a small internal resistance, it is true, but the driving of the transistor will be accompanied with relatively more delay. A relatively small discharge transistor 22 switches rapidly, it is true, but has a relatively large series resistance.

Figure 3:
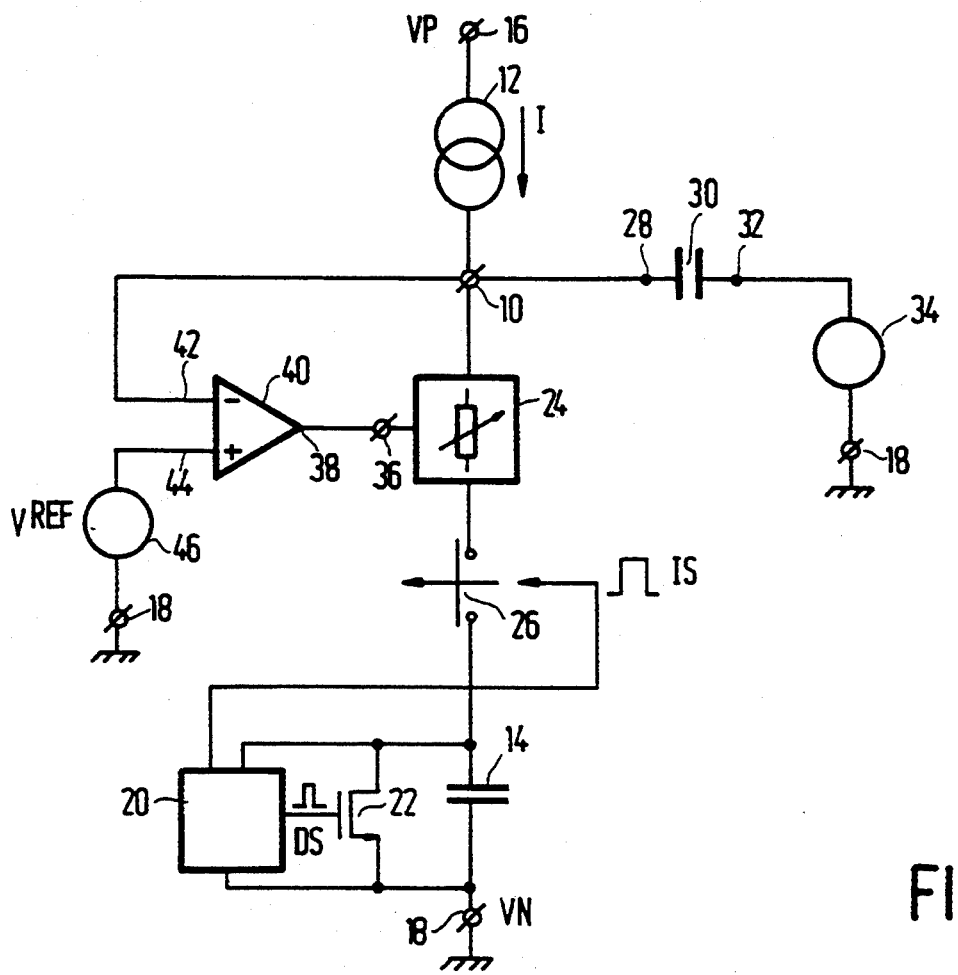
FIG. 3 shows a circuit diagram of a first embodiment of a sawtooth oscillator according to the invention.
Figure 4:
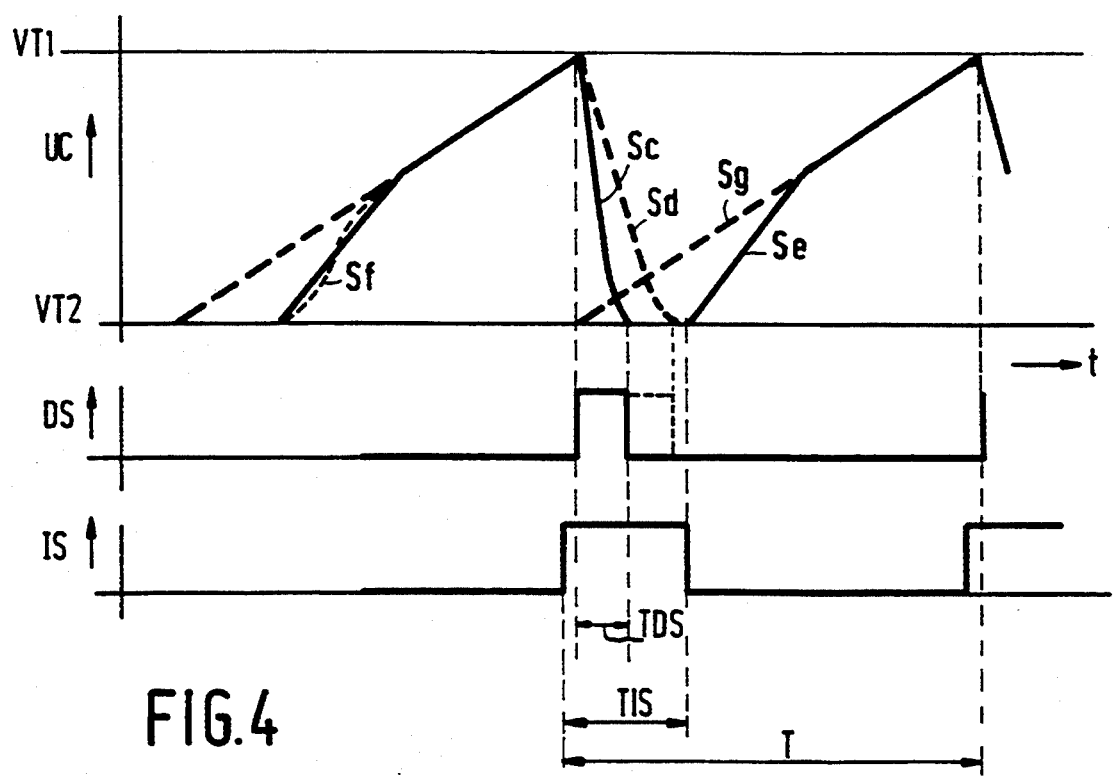
FIG. 4 shows diagrams in explanation of the operation of the sawtooth oscillator shown in FIG. 3.

FIG. 3 shows a circuit diagram of a sawtooth oscillator according to the invention. The output 10 is coupled to the first capacitor 14 by way of a series combination of a voltage-controlled resistor 24 and an interrupter 26. The output 10 is further connected to a first terminal 28 of a second capacitor 30, a second terminal 32 of which capacitor is connected to a voltage source 34. The voltage-controlled resistor 24 comprises a control terminal 36 connected to an output 38 of an amplifier 40, an inverting input 42 of which is connected to the output 10 and a non-inverting input 44 of which is connected to a reference voltage source 46 which supplies a reference voltage VREF1. The interrupter 26 is controlled by an interrupt signal IS from the window comparator 20. The relation between the discharge signal DS and the interrupt signal IS is represented in FIG. 4 in which again the voltage UC across the first capacitor 14 is shown. The interrupter 26 interrupts the current supply to the first capacitor 14 for an interrupt period TIS which preferably, but not necessarily, overlaps the discharge period TDS. During the interrupt period TIS the charge current I flows to the second capacitor 30 and builds up a charge surplus in the second capacitor 30. The first terminal 28 of the second capacitor 30 thereby becomes positive relative to the second terminal 32. During the interrupt period TIS the discharge transistor 22 discharges the first capacitor 14, the voltage UC showing a variation represented by curve Sc during the discharge period TDS. Curve Sd shows an alternative voltage variation if the discharging takes place more slowly as a result of tolerances. Once the first capacitor 14 has been discharged by the discharge transistor 22, a certain waiting period will follow during which the voltage UC does not increase. Once the interrupt period TIS has ended, the interrupter 26 terminates the interruption of the current supply to the first capacitor 14, so that the charge current I can again start flowing to the first capacitor 14. At the same time the charge surplus in the second capacitor 30 is transferred from the second capacitor 30 to the first capacitor 14 by way of the voltage-controlled resistor 24 and the interrupter 26 which is closed now. An additional current will now temporarily flow to the first capacitor 14 as is represented by curve Se, until the charge surplus in the second capacitor 30 has been compensated for. This compensation can be effected gradually over time or more or less in a pulse-shaped manner. All this depends, for example, on the internal impedance of the voltage source 34 and the controlling behaviour of the voltage-controlled resistor 24. Curve Sf gives an example of a possible variation of the voltage UC as a result of the compensating current. The amplifier 40 forces the voltage on the output 10 to return to the reference voltage VREF1, the voltage-controlled resistor 24 making it possible for the voltage UC on the first capacitor 14 to be independent of the voltage on the output 10. In this way it is possible for the voltage difference across the second capacitor 30, subsequent to the interrupt period TIS to eventually again equal the voltage difference just prior to the interrupt period TIS and thus the charge surplus built up during the interrupt period is completely transferred to the first capacitor 14. The discharge period TDS does not play any role now in the determination of the total period of time T. The complete available charge current I eventually ends in the first capacitor 14, as was the case in the ideal sawtooth oscillator, of which the variation of the voltage UC is represented by Sg.

For obtaining the intended effect, it is furthermore sufficient if part of or even the whole interrupt period TIS is situated within the discharge period TDS. In that case the influence of a varying discharge period TDS will only be partly eliminated.

Figure 5:
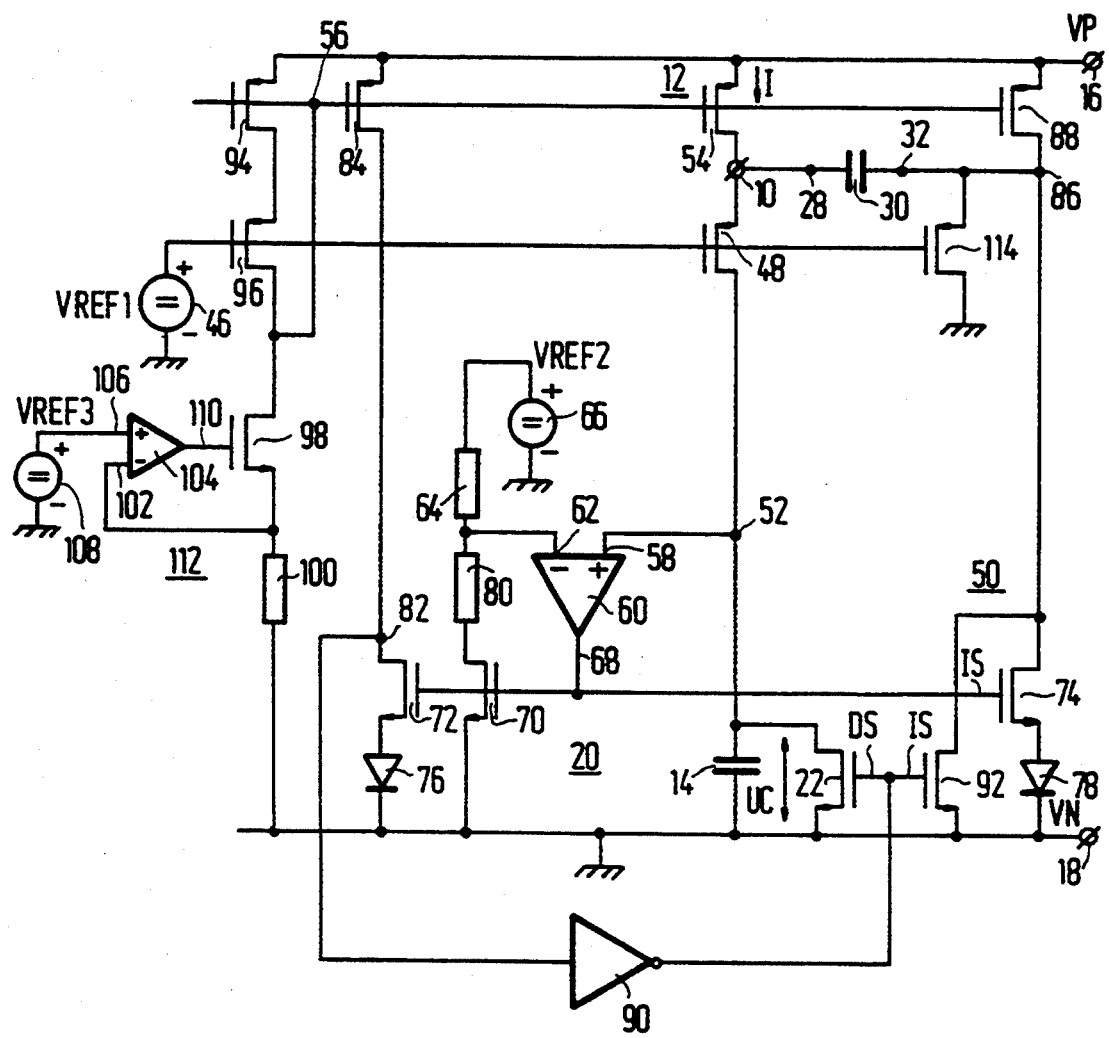
FIG. 5 shows a circuit diagram of a second embodiment of a sawtooth oscillator according to the invention.

FIG. 5 shows a circuit diagram of a sawtooth oscillator according to the invention which, in essence, is the same as that of FIG. 3 but in which the voltage-controlled resistor 24, the amplifier 40 and the interrupter 26 are replaced by a single PMOS-transistor 48 and in which the voltage source 34 is replaced by a switched voltage source 50. The source and gate of the PMOS-transistor 48 are connected to the output 10 and the reference voltage source 46 respectively. The drain of the PMOS-transistor 48 is connected at a junction 52 to the first capacitor 14. The current source 12 is arranged as a current-source-arranged PMOS-transistor 54, whose source, drain and gate are connected to the positive supply terminal 16, a voltage rail 56 and the output 10 respectively. The junction 52 is connected to a non-inverting input 58 of a comparator 60, an inverting input 62 of the comparator is connected by way of a resistor 64 to a reference voltage source 66 which supplies the reference voltage VREF2 relative to ground. The comparator 60 has an output 68 connected to the respective gates of an NMOS-transistor 70, NMOS-transistor 72 and NMOS-transistor 74. The source of the NMOS-transistor 70 is directly connected to the negative supply terminal 18. The sources of the NMOS-transistor 72 and the NMOS-transistor 74 are connected to the negative supply terminal 18 by way of a diode 76 and a diode 78 respectively. The drain of the NMOS-transistor 70 is connected to the inverting input 62 of the comparator 60 by way of a resistor 80. The drain of the NMOS-transistor 72 is connected at a junction 82 to the drain of a PMOS-transistor 84 whose source is connected to the positive supply terminal 16 and whose gate is connected to the voltage rail 56. The drain of the NMOS-transistor 74 is connected at a junction 86 to the drain of a current-source-arranged PMOS-transistor 88, whose source and gate are connected to the positive supply terminal 16 and the voltage rail 56 respectively. The second capacitor 30 is connected between the output 10 and the junction 86. The junction 82 is further connected by way of an inverting buffer 90 to the gate of the discharge transistor 22 and to the gate of an NMOS-transistor 92 whose source and drain are connected to the negative supply terminal 18 and the junction 86 respectively. The NMOS-transistor 92, the NMOS-transistor 74, the PMOS-transistor 88 and the junction 86 together form the switched voltage source 50. The voltage rail 56 is also connected to the gate of a PMOS-transistor 94, whose source is connected to the positive supply terminal 16 and whose drain is connected to the source of a PMOS-transistor 96. The gate of the PMOS-transistor 96 is connected to the reference voltage source 46, the drain being connected, on the one hand, to the voltage rail 56 and, on the other hand, to the drain of an NMOS-transistor 98. The source of the NMOS-transistor 98 is connected, on one hand, by way of a resistor 100 to the negative supply terminal 18 and, on the other hand, to an inverting input 102 of an amplifier 104, a non-inverting input 106 of which is connected to a reference voltage source 108 which produces a reference voltage VREF3 and an output 110 of which is connected to the gate of the NMOS-transistor 98. The NMOS-transistor 98, the resistor 100, the amplifier 104 and the reference voltage source 108 together form a reference current source 112.

The PMOS-transistor 94 and the PMOS-transistor 96 form the input branch of a current mirror circuit of which the PMOS-transistor 54 and the PMOS-transistor 48 form an output branch. The charge current I flowing through the PMOS-transistor 54 is equal or proportional to the current produced by the reference current source 112. This current, in turn, is equal to VREF3/R1, R1 being the resistance of the resistor 100. The charge current I flows through the PMOS-transistor 48 into the first capacitor 14, while the voltage UC at the junction 52 increases. The comparator 60 compares the voltage UC with the reference voltage VREF2 and once the voltage UC has exceeded a first threshold which is equal to the reference voltage VREF2, the output 68 becomes positive and renders NMOS-transistor 70 conductive. The NMOS-transistor 70 now connects the resistor 80 to ground, so that the voltage on the inverting input 62 obtains a second threshold which is a fraction of the reference voltage VREF2. This fraction is determined by the proportion between the resistor 80 and the resistor 64. Also the NMOS-transistor 72 is rendered conductive by way of the output 68 and also the discharge transistor 22 by way of the inverting buffer 90, so that the first capacitor 14 is discharged when the voltage UC reaches the first threshold. The diode 76 insures that the NMOS-transistor 70 is rendered conductive earlier than the NMOS transistor 72 and thus the threshold is reduced first after which the discharge of the first capacitor 14 is commenced. Once the voltage UC has reached the second threshold, the output 68 cuts-off the NMOS-transistor 70 and the NMOS-transistor 72 and, by way of the inverting buffer 90, the discharge transistor 22, and the charging of the first capacitor 14 is recommenced.

While the first capacitor 14 is being charged, the NMOS-transistor 74 and the NMOS-transistor 92 are not conductive either. The junction 86 and thus also the second terminal 32 of the second capacitor 30 is charged by way of the PMOS-transistor 88 up to the voltage VP on the positive supply terminal 16. It should be observed that the PMOS-transistor 88 may be replaced, as required, by a resistor, so as to charge the second terminal 32 up to the voltage VP. The voltage on the output 10 is equal to the sum of the reference voltage VREF1 and the gate-source voltage of the PMOS-transistor 48. Together with the NMOS-transistor 72, the NMOS-transistor 74 also is rendered conductive and, slightly later, so is the NMOS-transistor 92. This means that just prior to the discharging of the first capacitor 14 the junction 86 is switched to ground by the switched voltage source 50. The voltage jump occurring during this switching is transferred to the output 10 by way of the second capacitor 30. Consequently, the PMOS-transistor 48 is rendered non-conductive because the voltage on the source of the PMOS-transistor 48 is then lower than the voltage on the gate of the PMOS-transistor 48. The charge current I now flows completely into the second capacitor 30 and builds up a charge surplus there. Once the discharging of the first capacitor 14 has ended, both the NMOS-transistor 74 and the NMOS-transistor 92 are cut-off and the junction 86 will again be charged to the voltage VP by the PMOS-transistor 88. The charge current I will initially continue to flow into the second capacitor 30 until the output 10 has again become sufficiently positive for the PMOS-transistor 48 to be rendered conductive. The charge current I will now again flow to the first capacitor 14 by way of the PMOS-transistor 48. At the same time the charge surplus in the second capacitor 30 will flow to the first capacitor 14. Eventually, the voltage difference across the second capacitor 30 will again be equal to the voltage difference just prior to the start of the discharge operation of the first capacitor 14.

FIG. 5 further shows an optional PMOS-transistor 114 whose gate, source and drain are connected to the reference voltage source 46, the junction 86 and ground respectively. The PMOS-transistor 114 bounds the voltage excursion of the junction 86 and avoids switching noise being transferred to the positive supply terminal 16.

The invention has been clarified with the aid of exemplary embodiments in which unipolar transistors have been used. However, it is alternatively possible to use bipolar transistors whose base, emitter and collector then take the place of the gate, source and drain respectively. The diodes 76 and 78 increase the gate voltage necessary to render the transistors 72 and 74 conductive. An identical effect may be obtained by making the gate source threshold voltages of those transistors higher than the gate source threshold voltage of the transistor 70.

We claim:

1. A sawtooth oscillator comprising: a first capacitor, a current source having an output coupled to the first capacitor for supplying a charge current (I) to the first capacitor, means for discharging the first capacitor during a discharge period (TDS) in response to a voltage on the first capacitor, wherein the sawtooth oscillator further includes: a second capacitor coupled to the output of the current source, means for interrupting the supply of charge current (I) to the first capacitor during an interrupt period (TIS), at least a part of which interrupt period occurs during the discharge period (TDS), and supply means for supplying, subsequent to the interrupt period, the first capacitor with a charge surplus built up by the charge current (I) in the second capacitor.

2. A sawtooth oscillator as claimed in claim 1, wherein the discharge period occurs within the interrupt period.

3. A sawtooth oscillator as claimed in claim 2 wherein the supply means comprise: a voltage source coupled to a terminal of the second capacitor remote from the output of the current source, a voltage-controlled resistor having a main current path connected in series with the interrupting means and comprising a control terminal for connecting a control signal to control the resistance of the main current path, a reference voltage source and an amplifier having an inverting input and a non-inverting input, one of said inputs being coupled to the reference voltage source and the other input being coupled to the output of the current source, and wherein an output of said amplifier is coupled to the control terminal of the voltage-controlled resistor.

4. A sawtooth oscillator as claimed in claim 2 wherein the interrupting means and supply means comprise: a switched voltage source coupled to a terminal of the second capacitor remote from the output of the current source for supplying said remote terminal with a voltage (VN) which, during the interrupt period (TIS), deviates from a voltage (VP) outside the interrupt period, a reference voltage source, and a first transistor having a first main electrode, a second main electrode and a control electrode which are coupled to the output of the current source, the first capacitor and the reference voltage source, respectively.

5. A sawtooth oscillator as claimed in claim 1 wherein the supply means comprise: a voltage source coupled to a terminal of the second capacitor remote from the output of the current source, a voltage-controlled resistor having a main current path connected in series with the interrupting means and comprising a control terminal for connecting a control signal to control the resistance of the main current path, a reference voltage source and an amplifier having an inverting input and a non-inverting input, one of which inputs is coupled to the reference voltage source and the other input being coupled to the output of the current source, and wherein an output of said amplifier is coupled to the control terminal of the voltage-controlled resistor.

6. A sawtooth oscillator as claimed in claim 1 wherein the interrupting means and supply means comprise: a switched voltage source coupled to a terminal of the second capacitor remote from the output of the current source, for supplying said remote terminal with a voltage (VN) which, during the interrupt period (TIS), deviates from a voltage (VP) outside the interrupt period, a reference voltage source, and a first transistor having a first main electrode, a second main electrode and a control electrode which are coupled to the output of the current source, the first capacitor and the reference voltage source, respectively.

7. A sawtooth oscillator as claimed in claim 6, wherein the switched voltage source comprises: a series combination of a second transistor arranged as a current source and a switch transistor connected thereto at a junction, a control electrode of the switch transistor being coupled to a control signal (DS, IS) for rendering the switch transistor conductive during the interrupt period, and wherein said remote terminal of the second capacitor is coupled to the junction.

8. A sawtooth oscillator as claimed in claim 7, wherein the current source comprises: a third transistor which includes a first main electrode, a second main electrode and a control electrode, the first main electrode and the control electrode of the third transistor being connected to corresponding electrodes of the second transistor and the second main electrode of the third transistor being connected to the output of the current source.

9. Sawtooth oscillator as claimed in claim 8, further comprising a fourth and a fifth transistor each comprising a first main electrode, a second main electrode and a control electrode, the first main electrode and the control electrode of the fourth transistor being connected to corresponding electrodes of the third transistor, the second main electrode of the fourth transistor being connected to the first main electrode of the fifth transistor, the control electrode of the fifth transistor being connected to the reference voltage source and the second main electrode of the fifth transistor being connected to the control electrode of the fourth transistor and to a reference current source.

10. A sawtooth oscillator as claimed in claim 9, further comprising: a sixth transistor which comprises a first main electrode, a second main electrode and a control electrode which are connected to the junction, a supply terminal and the reference voltage source respectively.

11. A sawtooth oscillator as claimed in claim 7, further comprising: a third transistor which comprises a first main electrode, a second main electrode and a control electrode which are connected to the junction, a supply terminal and the reference voltage source, respectively.

12. The sawtooth oscillator as claimed in claim 1 wherein the interrupting means comprise:
  a first transistor coupled between the output of the current source and the first capacitor, and
  a reference voltage source coupled to a control electrode of the first transistor.

13. The sawtooth oscillator claimed in claim 1 wherein said interrupting means includes a controlled switch coupled between said output of the current source and said first capacitor and controlled in response to the voltage on the first capacitor, and wherein said second capacitor receives a charge current from said current source during the interrupt period.

14. The sawtooth oscillator as claimed in claim 1 wherein said discharging means comprises a transistor connected across the first capacitor, and comparison means having an input coupled to said capacitor and having first and second outputs for control of said transistor and said interrupting means, respectively, such that the discharge period ends before the interrupt period ends.

15. The sawtooth oscillator as claimed in claim 1 wherein said current source comprises;
a current mirror having an input branch coupled to a source of reference current and an output branch coupled to said current source output.

* * * * *